United States Patent
Saltoun et al.

(10) Patent No.: US 11,249,400 B2
(45) Date of Patent: Feb. 15, 2022

(54) PER-SITE RESIDUALS ANALYSIS FOR ACCURATE METROLOGY MEASUREMENTS

(71) Applicant: KLA CORPORATION, Milpitas, CA (US)

(72) Inventors: Lilach Saltoun, Qiriat Ono (IL); Tal Marciano, Zychron Yaacov (IL); Dana Klein, Haifa (IL)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 16/609,736

(22) PCT Filed: Sep. 30, 2019

(86) PCT No.: PCT/US2019/053715
§ 371 (c)(1),
(2) Date: Oct. 30, 2019

(87) PCT Pub. No.: WO2020/123014
PCT Pub. Date: Jun. 18, 2020

(65) Prior Publication Data
US 2020/0371445 A1 Nov. 26, 2020

Related U.S. Application Data

(60) Provisional application No. 62/780,005, filed on Dec. 14, 2018.

(51) Int. Cl.
*G03F 7/20* (2006.01)
*G01B 11/27* (2006.01)

(52) U.S. Cl.
CPC ........ *G03F 7/70625* (2013.01); *G01B 11/272* (2013.01); *G03F 7/70633* (2013.01)

(58) Field of Classification Search
None
See application file for complete search history.

(56) References Cited

U.S. PATENT DOCUMENTS 7,198,964 B1 * 4/2007 Cherry ................ H01L 22/20
438/14
7,229,845 B1 * 6/2007 Luu ..................... G06Q 50/04
257/E21.525

(Continued)

FOREIGN PATENT DOCUMENTS

WO WO-2014210384 A1 * 12/2014 ......... G03F 7/70633
WO 2018217232 A1 11/2018

OTHER PUBLICATIONS

Brunner et al. ("Characterization of wafer geometry and overlay error on silicon wafers with nonuniform stress." 2013, Journal of Micro/Nanolithography, MEMS, and MOEMS, 12. (Year: 2013).*

(Continued)

*Primary Examiner* — Roy Y Yl
(74) *Attorney, Agent, or Firm* — Hodgson Russ LLP

(57) ABSTRACT

Systems, metrology modules and methods are provided, which identify, per wafer site, components of residuals from measurement of metrology metric(s), and optimize measurement parameters for each site, according to the identified residuals' components. Certain embodiments utilize metric landscapes to identify sensitive sites and/or to identify sites exhibiting highest accuracy, and corresponding metrics may be combined over the wafer to further enhance the metrology performance. Zonal analysis may be used to reduce the systematic errors, and disclosed per-site analysis may be used to further reduce the non-systematic error components, and relate the remaining residuals components to process variation over the wafer.

20 Claims, 8 Drawing Sheets

(56) References Cited

U.S. PATENT DOCUMENTS

| | | |
|---|---|---|
| 7,570,796 B2 | 8/2009 | Zafar et al. |
| 2011/0170091 A1 | 7/2011 | Chang et al. |
| 2014/0273291 A1 | 9/2014 | Huang et al. |
| 2016/0313658 A1 | 10/2016 | Marciano et al. |
| 2017/0160073 A1 | 6/2017 | Elings et al. |
| 2018/0023950 A1 | 1/2018 | Marciano et al. |
| 2018/0047646 A1 | 2/2018 | Bringoltz et al. |
| 2018/0252514 A1 | 9/2018 | Pandev et al. |

OTHER PUBLICATIONS

WIPO, ISR for PCT/US2019/053715, dated Jan. 13, 2020.

* cited by examiner

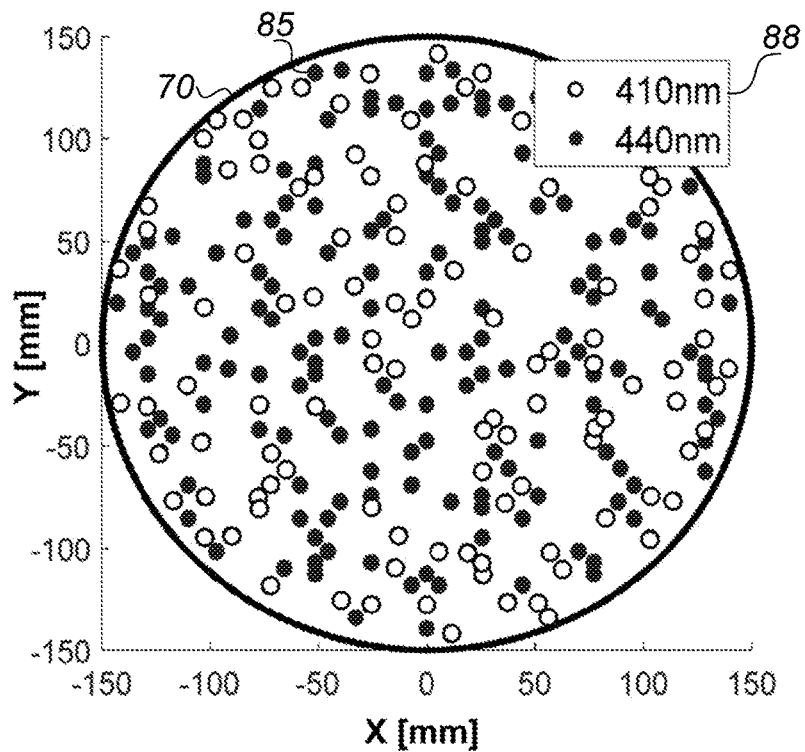
Figure 7C – Prior art
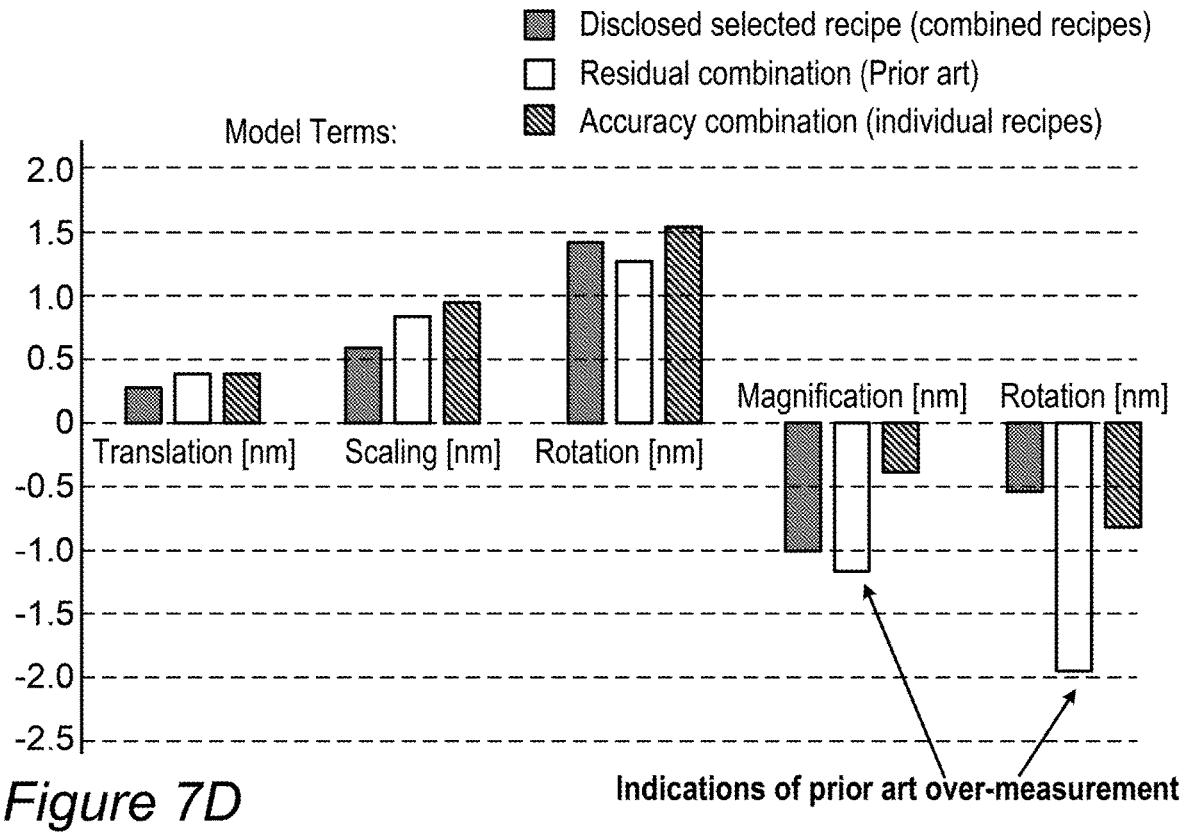
Figure 7D

PER-SITE RESIDUALS ANALYSIS FOR ACCURATE METROLOGY MEASUREMENTS

BACKGROUND OF THE INVENTION

1. Technical Field

The present invention relates to the field of metrology, and more particularly, to metrology recipe setup and measurement procedures.

2. Discussion of Related Art

Metrology measurements are carried out according to measurement recipes, which are optimized according to setup and measurement parameters. For example, U.S. Pat. No. 7,570,796, which is incorporated herein by reference in its entirety, discloses various methods and systems for utilizing design data in combination with inspection data such as by comparing portions of design data in proximate positions to the defects in design data space and binning the defects in groups such that the portions of the design data proximate the positions of the defects in each of the groups are at least similar.

In another example, WIPO Publication No. 2018217232, which is incorporated herein by reference in its entirety, discloses metrology methods and modules which comprise carrying out recipe setup procedure(s) anchor metrology measurement(s) using zonal analysis with respect to respective setup parameters) and/or metrology metric(s). The zonal analysis comprises relating to spatially variable values of the setup parameter(s) and or metrology metric(s) across one or more wafers in one or more lots. Wafer zones may be discrete or spatially continuous, and be used to weight one or more parameters) and/or metric(s) dining any of the stages of the respective setup and measurement processes.

Analysis of metrology measurements across wafers or zones may be carried out with respect to one or more metrology landscape, that relates to an at least partially continuous dependency of at least one metrology metric (e.g., overlay for the overlay landscape) on at least one metrology measurement recipe parameter (e.g., illumination parameters), which may be derived by simulation or in measurements. The derived dependency may be used to relate metrology measurements and process parameters in an analytical way or through simulation—as disclosed in U.S. Application Publication Nos. 2016/0313658 and 2018/0023950, incorporated herein by reference in then entirety.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method comprising: identifying, per wafer site, components of residuals from measurement of at least one metrology metric, and optimizing measurement parameters for each site, according to the identified residuals' components, wherein at least one of the identifying and the optimizing is carried out by at least one computer processor.

These, additional, and/or other aspects and or advantages of the present invention are set forth in the detailed description which follows; possibly inferable from the detailed description; and or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 7A-7D are high-level schematic illustrations the improved accuracy achieved by combining recipes over the wafer, according to some embodiments of the invention.

DETAILED DESCRIPTION OF THE INVENTION

Figure 1:
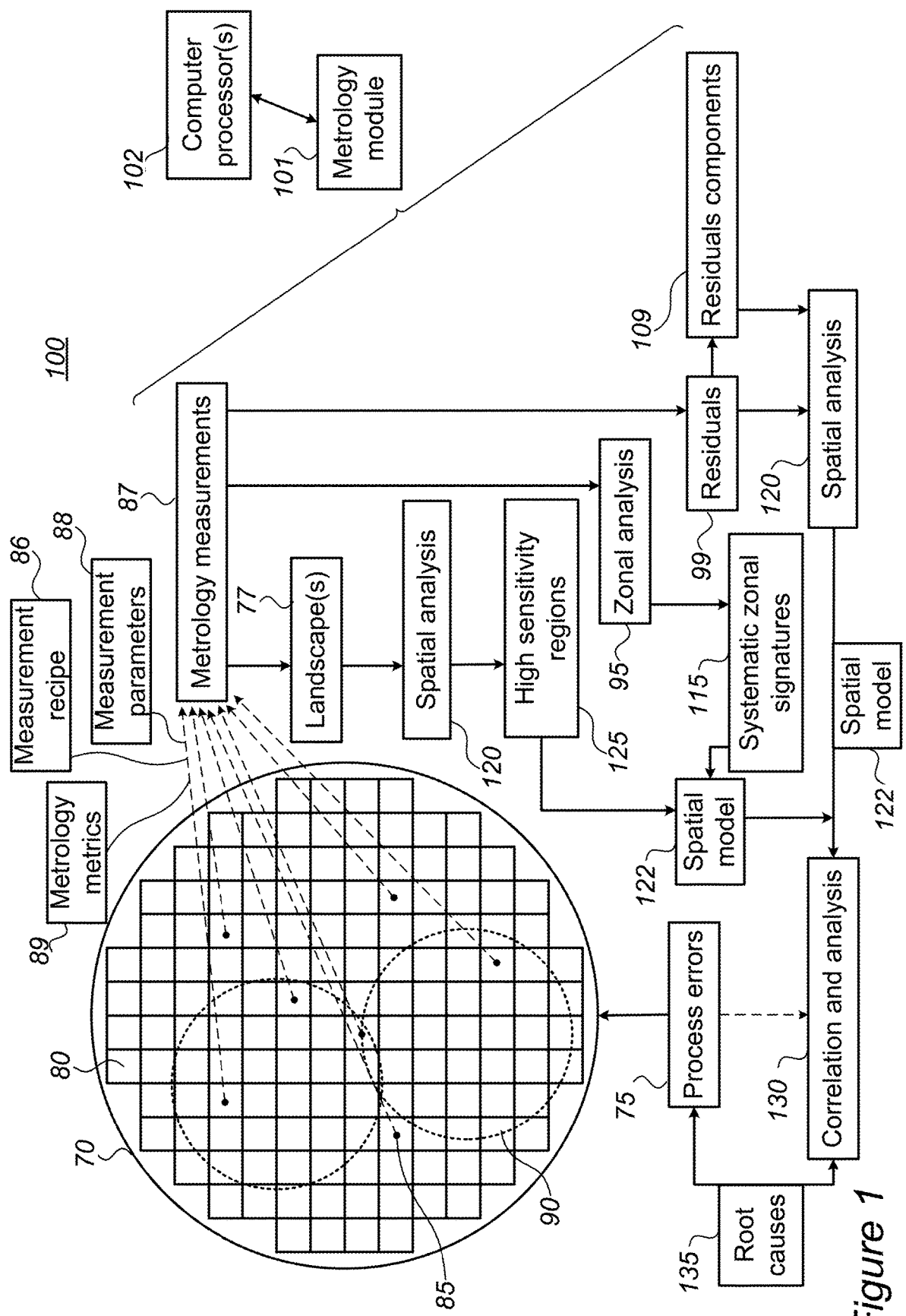
FIG. 1 is a high-level schematic block diagram of systems, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented m the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanism for improving metrology performance and thereby provide improvements to the technological field of semiconductor production processes. Systems, metrology modules and methods are provided, which identify, per wafer site, components of residuals from measurement of metrology metric(s), and optimize measurement parameters for each site, according to the identified residuals' components. Certain embodiments utilize metric landscapes to identify sensitive sites and/or to identify sites exhibiting highest accuracy, and corresponding metrics may be combined over the wafer to further enhance the metrology performance. Zonal analysis may be used to reduce the systematic errors, and disclosed per-site analysis may be used to further reduce the non-systematic error components, and relate the remaining residuals components to process variation over the wafer.

In various embodiments, disclosed systems and methods improve the reported metrology performances by using a combination of different landscapes over the area of the wafer. Division to different zones or the selection of landscapes per site may be carried out by tracking metrics changes in value and behavior across the wafer. Any overlay metrology tool may be configured to carry out disclosed methods and incorporate disclosed metrology modules, to implement the disclosed methodology for breaking the residuals from the modeled overlay to their different contributions related to the quality of fitting, inaccuracy, process noise, etc.

Figure 2:
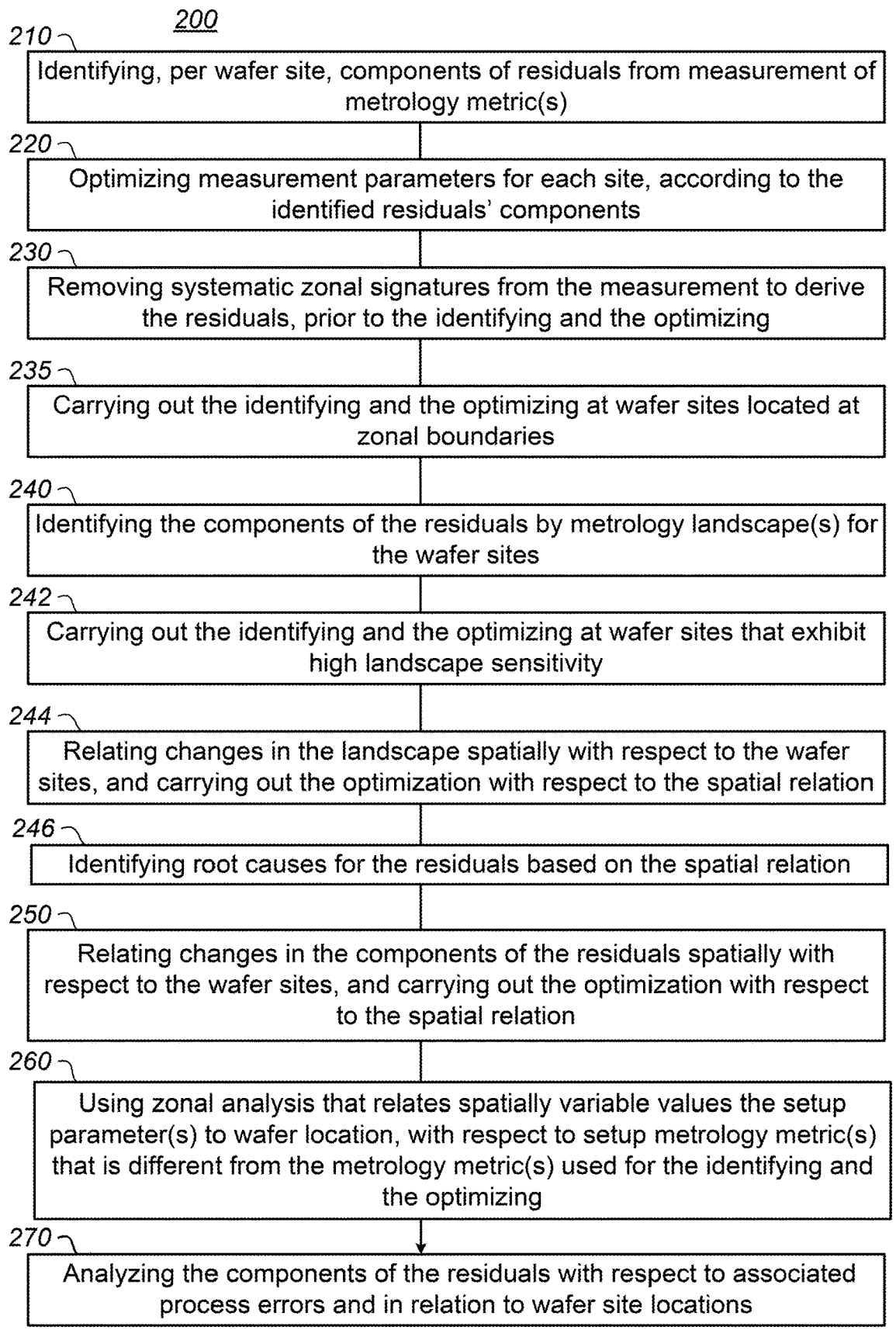
FIG. 2 is a high-level flowchart illustrating methods, according to some embodiments of the invention.
Figure 3:
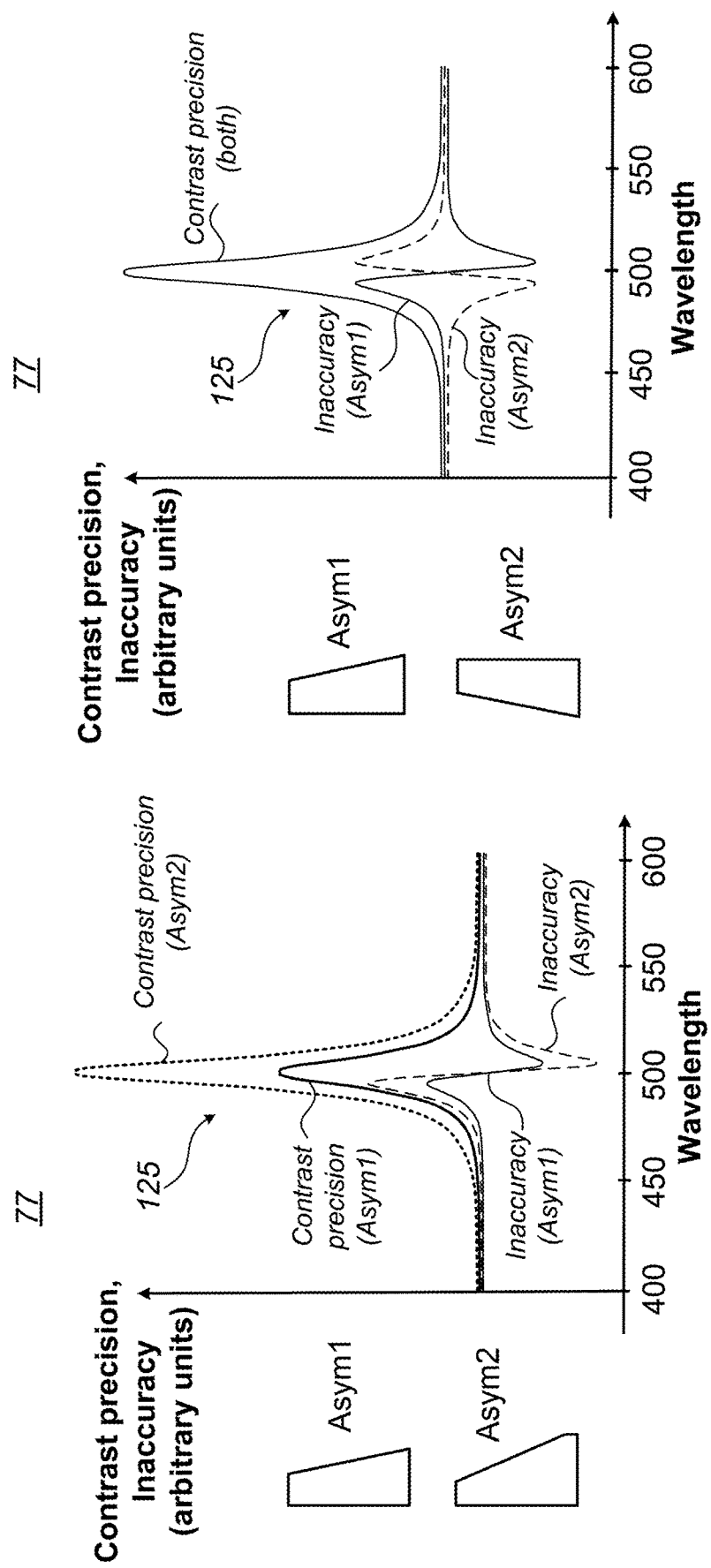
FIGS. 3A and 3B illustrate schematically inaccuracy landscape parts with respect to the wavelength as parameter, for different types of asymmetry, according to some embodiments of the invention.

FIG. 1 is a high-level schematic block diagram of systems 100, according to some embodiments of the invention. FIG. 2 is a high-level flowchart illustrating methods 200, according to some embodiments of the invention. The method stages may be carried out with respect to systems 100, which may optionally be configured to implement method 200. Method 200 may be at least partially implemented by at least one computer processor 102, e.g., in a metrology module 101. Certain embodiments comprise computer program products comprising a computer readable storage medium having computer readable program embodied therewith and configured to carry out the relevant stages of method 200. Metrology module 101 may comprise, or be associated with one or more computer processors) 102 as part of metrology module 101 or associated therewith. Method 200 may comprise any of the following stages, irrespective of their order. Systems 100 and methods 200 are disclosed in the following and exemplified in FIGS. 3-7D.

Systems 100 and metrology modules 101 are configured to carry out metrology measurements 87, at specified measurement parameters 88 (e.g., illumination parameters, tool settings, optical measurement parameters etc.) of respective measurement recipe 86, of multiple targets at various sites 85 in a plurality of fields 80 of one or more wafer 70.

Metrology modules 101 may be configured to identify, per wafer site 85, components 109 of residuals 99 from measurement of at least one metrology metric 89, and to optimize measurement parameters 88 for each site 85, according to the identified residuals' components 109. Correspondingly, method 200 may comprise identifying, per wafer site, components of residuals from measurement of at least one metrology metric (stage 210), and optimizing measurement parameters for each site, according to the identified residuals' components (stage 220), wherein identifying 210 and/or optimizing 220 may be carried out by computer processors) 102. For example, in certain embodiments, identifying 210 of the residuals' components may be earned out by principal component analysis (PCA) or by equivalent methods.

In certain embodiments, metrology module 101 may be further configured to identify components 109 of residuals 99 by comparing at least one metrology landscape 77 for wafer sites 85, wherein metrology landscape(s) 77 comprises at least partially continuous dependency(ies) of at least one metrology metric 89 on at least one metrology measurement recipe parameter 88. Method 200 may correspondingly comprise identifying the components of the residuals by comparing at least one metrology landscape for the wafer sites (stage 240).

Landscapes 77, as taught e.g., by U.S. Application Publication Nos. 2016/0313658 and 2018/0023950, incorporated herein by reference in their entirety, provide discrete or at least party continuously relations between metrology metric(s) 89 (e.g., measurability, quality, accuracy metrics) and corresponding measurement parameters) 88; and can be used to detect, characterize and handle various features and errors in the production process.

For example, FIGS. 3A and 3B illustrate schematically inaccuracy landscape parts with respect to the wavelength as parameter, for different types of asymmetry, according to some embodiments of the invention. FIG. 3A illustrates schematically different inaccuracy intensities and FIG. 3B illustrates schematically different inaccuracy orientations and corresponding sign. FIGS. 3A and 3B schematically illustrate resonant regions 125 in landscapes 77 that are extremely sensitive to different kinds of process variations over wafer 70, illustrated schematically in FIGS. 3A and 3B. Such resonance regions 125 may be utilized to relate the metrology parameters to the respective process variation, e.g., in spatial model 122, and thereby to reduce the accompanying inaccuracy. For example, root causes 135 for the process variation may be identified, e.g., as specific deviations in any of the processes used to produce the wafer, such as scanner aberrations, process noise, chemical mechanical processing (CMP) effects, etching inaccuracies, and so forth. It is further noted that process variation changes across wafer 70 in type and in strength, and that different overlay metrology metrics 89 may be used to track the process variation within wafers 70 and/or from one wafer 70 to another water 70, identifying signature(s) of the related process variation to analyze and derive root causes 135, which may then be corrected. Method 200 may correspondingly comprise identifying root causes for the residuals based on the spatial relation (stage 246).

In certain embodiments, metrology module 101 may be further configured to carry out identifying 210 and optimizing 220 at wafer sites 85 that exhibit high landscape sensitivity, possibly to relate changes in landscape(s) 77 spatially with respect to wafer sites 85, and optionally carry out optimization 220 with respect to the derived spatial relation. Method 200 may further comprise carrying out the identifying and the optimizing at wafer sites that exhibit high landscape sensitivity (stage 242), possibly relating changes in the landscape spatially with respect to the wafer sites and optionally carrying out the optimization with respect to the spatial relation (stage 244).

In certain embodiments, metrology module 101 may be configured to relate changes in components 109 of residuals 99 spatially with respect to wafer sites 85, and carry out optimization 220 with respect to the spatial relation. Method 200 may further comprise relating changes in the components of the residuals spatially with respect to the wafer sites, and carrying out the optimization with respect to the spatial relation (stage 250). For example, the spatial relation may be at least partly continuous over wafer 70.

As metrology measurements 87 (e.g., the overlay error) are related to target asymmetries, the measurement results are influenced by the distribution of process variation (e.g., structure asymmetries. SWA—side wall angles—as illustrated in FIGS. 3A and 3B) over wafer 70. Advantageously, spatial correlation and corresponding correction disclosed herein may therefore enhance measurement accuracy, enable tracking the accuracy and provides robust metrology (e.g., overlay) measurements 87 using different overlay metrics 89. In various embodiments, disclosed systems 100 and methods 200 increase the accuracy and robustness of overlay metrology significantly, significantly reduce the residual part of the metrology measurement model and/or provide breakdown schemes for the specific and different contributions to residual 99 by different process factors or errors 75, improving the extraction of collectable terms.

Spatial analysis 120 of measurements 87 may be applied to any of the distribution of sites 85, zones 90 and/or landscape(s) 77 and their characteristics (e.g., transition points of regions, sig, slopes, etc.) and may be configured to yield a spatial model 122 of wafer 70 with respect to measurement characteristics such as used recipes 86, sensitivities to measurement parameters, process variation and errors 75 etc.

Certain embodiments comprise refining and/or utilizing the zonal analysis disclosed in WIPO Publication No. 2018217232, which is incorporated herein by reference in its entirety. As illustrated schematically in FIG. 1, zones 90 may comprise a relation between spatially variable values of the setup parameters) 88 and/or metrology metric(s) 89 across one or more wafers 70 in one or more lots. Wafer zones 90 may be discrete or spatially continuous.

Certain embodiments comprise metrology module(s) 101 further configured to remove systematic zonal signatures 115 from measurement(s) 87 to derive residuals 99, prior to identifying 210 and optimizing 220. Methods 200 may comprise removing systematic zonal signatures from the measurement to derive the residuals, prior to the identifying and the optimizing (stage 230).

Figure 4:
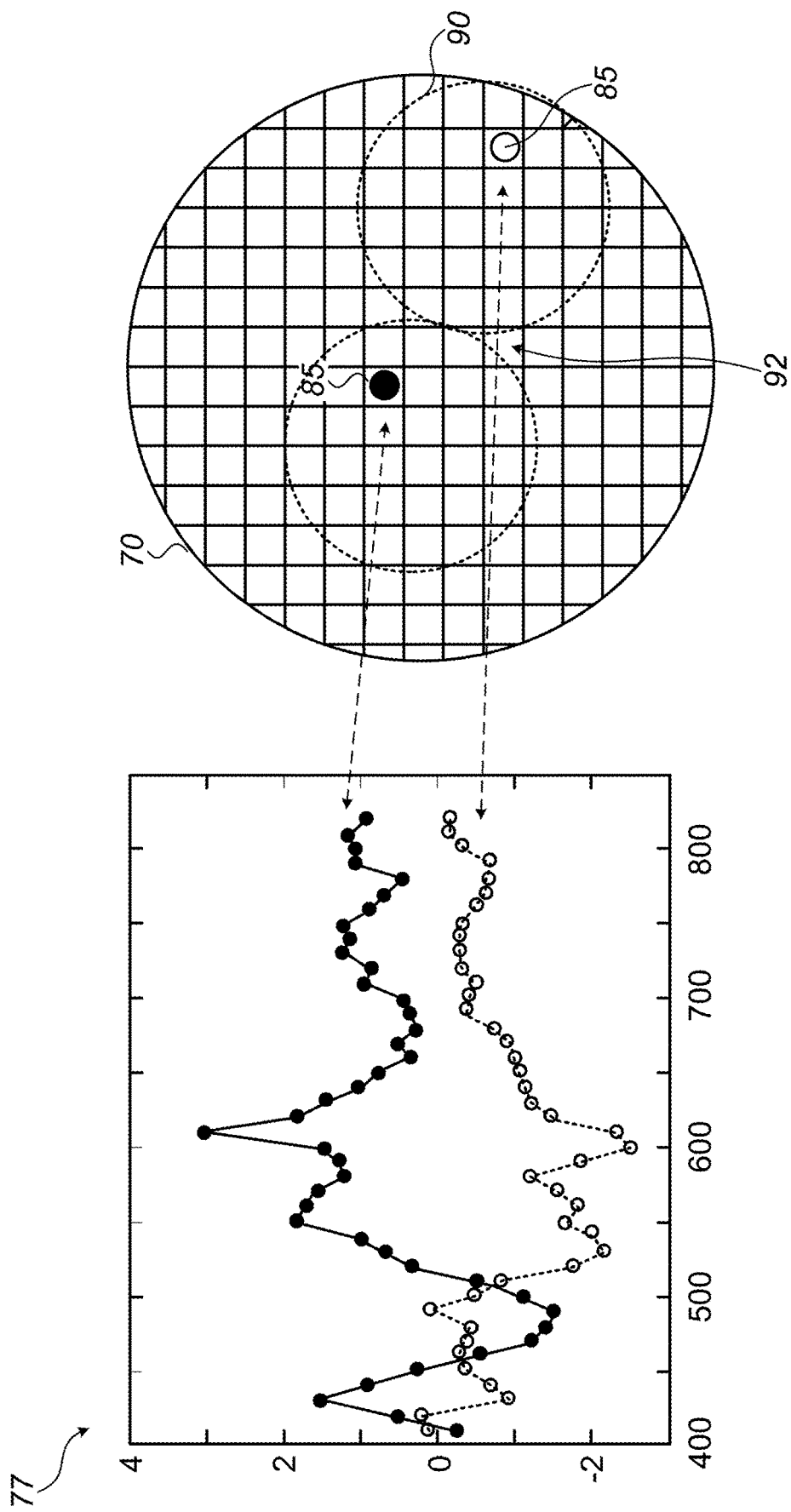
FIGS. 4 and 5 are high-level schematic illustrations of changes of an accuracy metric in two wafer locations, according to some embodiments of the invention.
Figure 5:
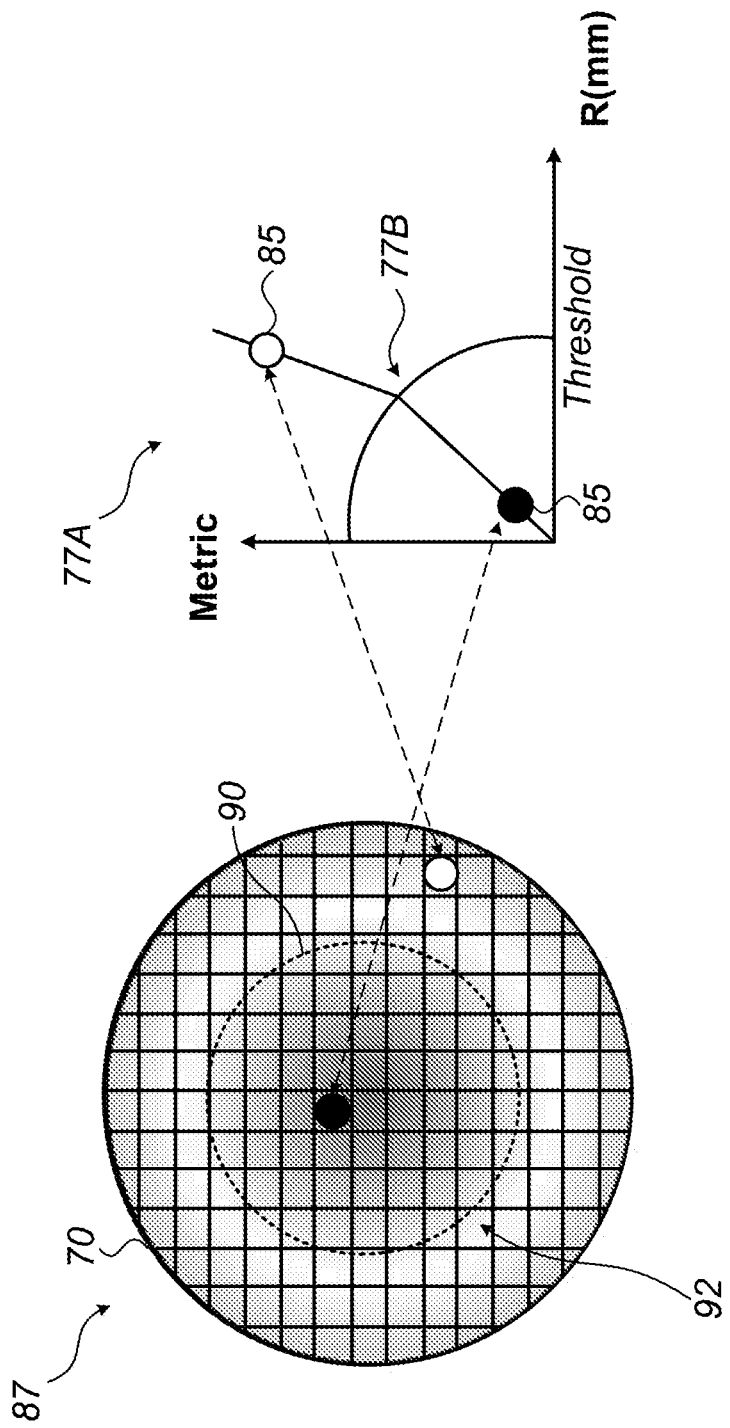

FIGS. 4 and 5 are high-level schematic illustrations of changes of an accuracy metric in two wafer locations 85, according to some embodiments of the invention. Landscapes 77 of accuracy metric 89 are illustrated in FIG. 4 for two different locations 85, located at different zones 90 (illustrated schematically, in a non-limiting manner with respect to the shape, size or other parameters of zones 90 and with respect to the relative positions of sites 85 within zones 90).

In certain embodiments, systems 100 and methods 200 may be configured to measure wafers 70 by integrating the identification of different regions in landscapes 77 at sites 85 (e.g., resonance regions and regions with low sensitivity) and the spatial changes in landscape 77 across sites 85 on wafer 70. The integration of landscape information and the spatial variability of the landscape may be used to derive a hybrid measurement recipe which utilizes selected landscape regions at corresponding selected regions of wafer, to minimize inaccuracy and moreover suggest root cause analysis of the process variation.

In certain embodiments, systems 100 and methods 200 may be configured to derive connections between different process variation factors (and/or process errors 75) and different zones 90, and refine the metrology results accordingly.

In certain embodiments, systems 100 and methods 200 may be configured to identify different process errors 75 relating to different zones 90, e.g., structures in one zone 90 may exhibit top tilt while structures in another zone 90 may exhibit SWA, with the change of the asymmetric variation originating in the physical target. Zonal analysis 95 may be configured to detect fire change point (or boundary 92, which may comprise point(s), lines(s) or even area(s) between zones 90) of the explored metric, and set the measurement setup to the optimal per process variation. For example, systems 100 and methods 200 may be configured to carry out the identifying and the optimizing at wafer sites located at zonal boundaries 92, illustrated schematically in FIG. 4 in a non-limiting manner, as boundaries 92 may have any shape and may be fuzzy, covering certain area(s) of wafer 70 between zones 90.

As illustrated in FIG. 5 schematically, metric value(s) 87 for specified recipes may have specified distributions of wafer 70, which may be utilized to derive landscape characteristics 77A such as transition points or regions 77B, in the illustrated case non-differential point 77B, having an undefined derivative due to the change in slope at the specified distance (indicated as "threshold") from the center of wafer 70. It is noted that schematically illustrated metric value(s) 87 may represent multiple types of metrics 89 or their combinations, and the illustration is simplified to enhance the clarity of the explanation. It is noted that in terms of zonal analysis, zone 90 may be defined as being within the threshold radius and another zone may be defined as being outside the threshold radius, the zones being separated by boundary 92 at the threshold radius. It is further noted that the described analysis corresponds to one measurement recipe, and may vary between recipes, providing additional data that can be derived by combination of identified thresholds over changing recipes and corresponding relations between changes in measurement parameters 88 and changes in thresholds and boundaries 92.

In certain embodiments, systems 100 and methods 200 may be configured to identify different metric parameters related to the same process variation, relating to different zones 90 or boundaries with respect to the same process variation. Zonal analysis 95 may be configured to detect the change point(s) (or boundary 92, which may comprise point(s), line(s) or even area(s) between zones 90) of the explored metric, and set the measurement setup to the optimal per process variation. For example, systems 100 and methods 200 may be configured to carry out the identifying and the optimizing at wafer sites located at zonal boundaries 92, illustrated schematically in FIG. 5 in a non-limiting manner, as boundaries 92 may have any shape and may be fuzzy, covering certain area(s) of wafer 70 between zones 90. For example, changes in the values of process variation 75 may yield sites 85 and/or zones 90 as parts of wafer 70 which are highly sensitive to the process variation while other parts may be more mildly sensitive, or not sensitive at all—using the same recipe.

Systems 100 and methods 200 may be configured to use different recipes 86 to different parts of wafer 90, such as zones 90, groups of sites 85 and/or zone boundary regions 92, according to the corresponding most accurate recipe 86 in each part. It is noted that the examples illustrated in FIGS. 4 and 5 are simplified, and that zones 90 corresponding to the accuracy metric signatures may have any shape, e.g., not necessarily circular and/or central, and may have any shape on wafer 70. The number of zones 90 is also not limited, e.g., wafer 70 may be divided to multiple zones 90, each allocated a different recipe for metrology measurements. Zone arrangement and measurement recipes may be validated during operation, e.g., by calculating corresponding accuracy metrics 89 on new wafers 70 and comparing calculation models 122 for new wafers 70.

Certain embodiments comprise metrology module(s) 101 further configured to use zonal analysis 95 that relates spatially variable values of at least one setup parameter to wafer location, with respect to at least one setup metrology metric 89 that is different from at least one metrology metric 89 that is used to carry out identifying 210 and optimizing 220. Methods 200 may comprise using zonal analysis that relates spatially variable values of at least one setup parameter to wafer location, with respect to at least one setup metrology metric that is different from the at least one metrology metric that is used to carry out the identifying and the optimizing (stage 260). In certain embodiments, zonal analysis 95 may be at least partly discrete with respect to wafer sites 85. In certain embodiments, zonal analysis 95 may be at least partly continuous with respect to wafer sites 85.

Figure 6:
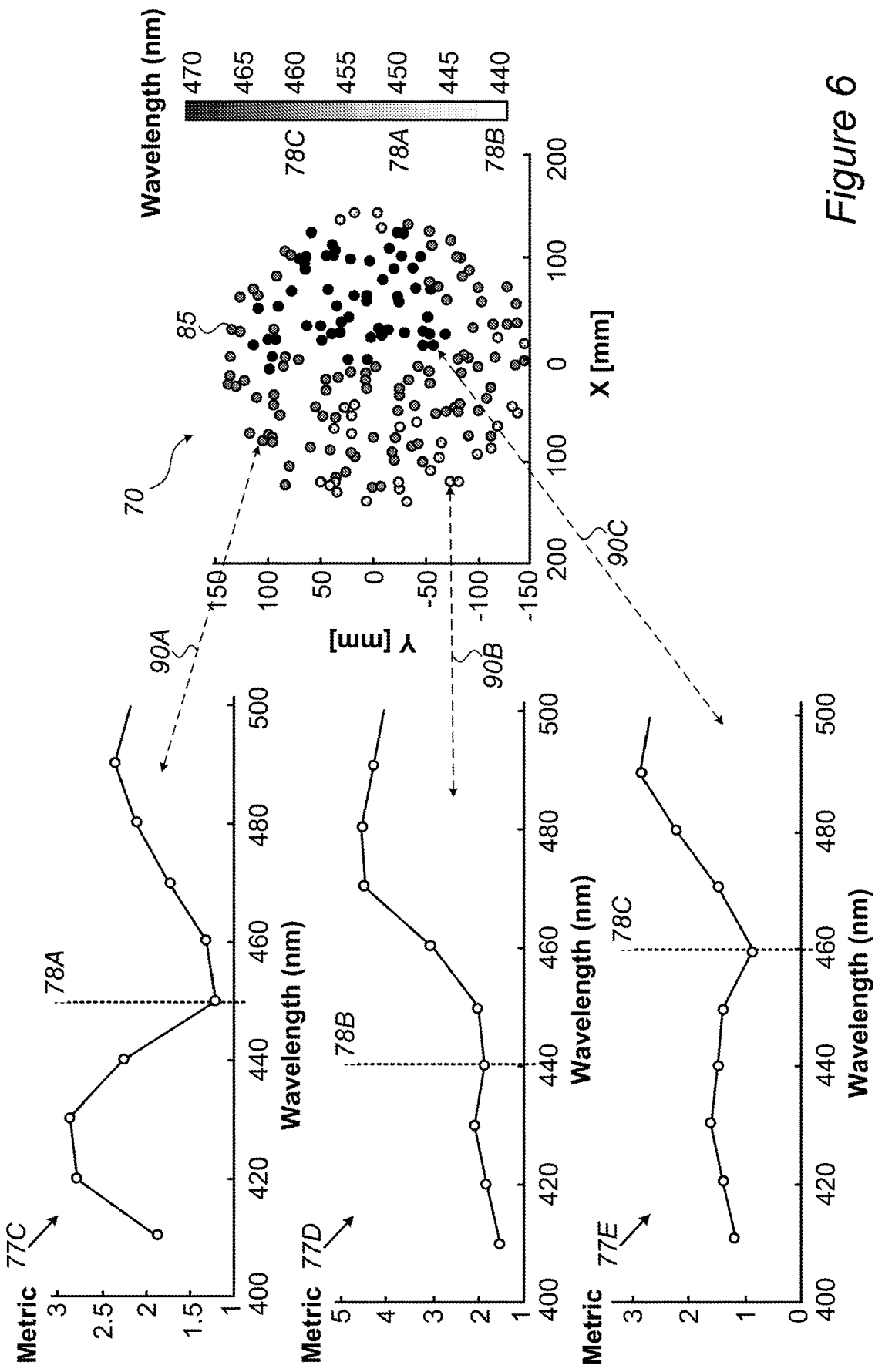
FIG. 6 is a high-level schematic illustration of landscapes of an inaccuracy metric on different locations on wafer, and the corresponding division of the wafer to different zones according to the movement of the most accurate point, according to some embodiments of the invention.

FIG. 6 is a high-level schematic illustration of landscapes 77 of an inaccuracy metric 89 on different locations 85 on wafer 70, and the corresponding division of wafer 70 to different zones 90 according to the movement of the most accurate point, according to some embodiments of the invention. The illustrated example is based on ca. 200 site measurements on IBO (Image Based Overlay) targets. Illustrated landscapes 77 include three types of landscapes 77C, 77D, 77E of the measured example, with corresponding three most accurate points 78A, 78B, 78C on the respective landscapes, indicating measurement parameters 88 (in the illustrated case—the illumination wavelength) which minimize inaccuracy metric 89. Corresponding sites 85 on wafer 70 are indicated according to measurement parameter 88 of respective most accurate point 78A, 78B, 78C, yielding corresponding zones 90A, 90B, 90C, each including sites 85 in winch the most accurate points are at corresponding wavelengths. It is noted that shift of the most accurate point with respect to the measurement parameter across the wafer is distinctly observable. The illustrated division of wafer 70 into zones 90 is schematic and served as a non-limiting example. It is noted that multiple number of zones 90 may be defined with respect to multiple measurement parameters 88 and/or multiple metrology metrics 89, and that zones 90 may have spatially discrete and/or continuous parts on wafer 70. It is also noted that in certain embodiments, zones 90 over wafer 70 may be selected with respect to one or more certain metrics, while measurement recipe(s) 86 may be selected according to different one or more metrics 89.

Figure 7A:
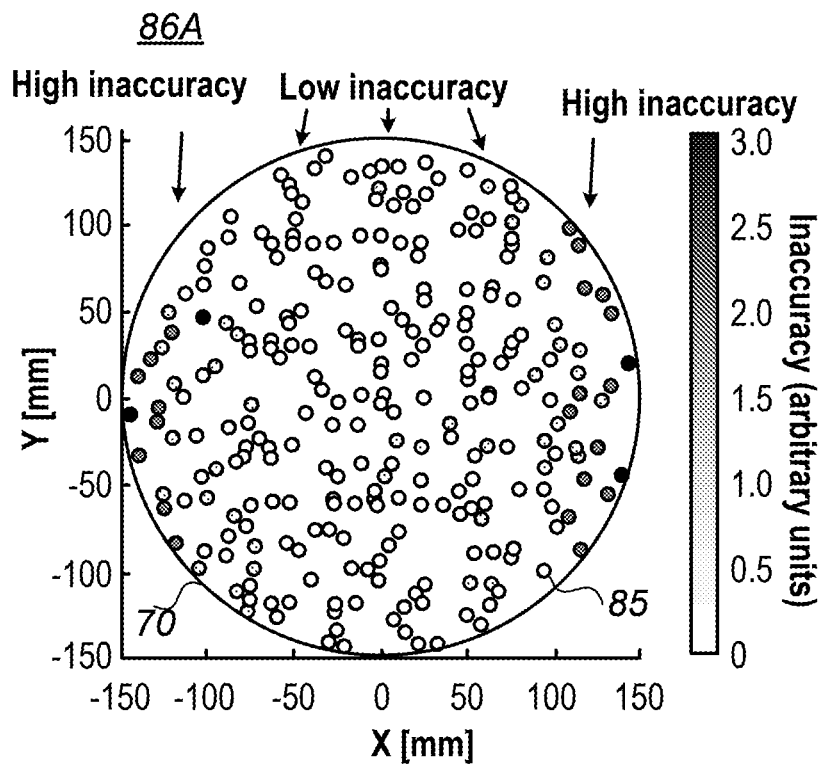
Figure 7B:
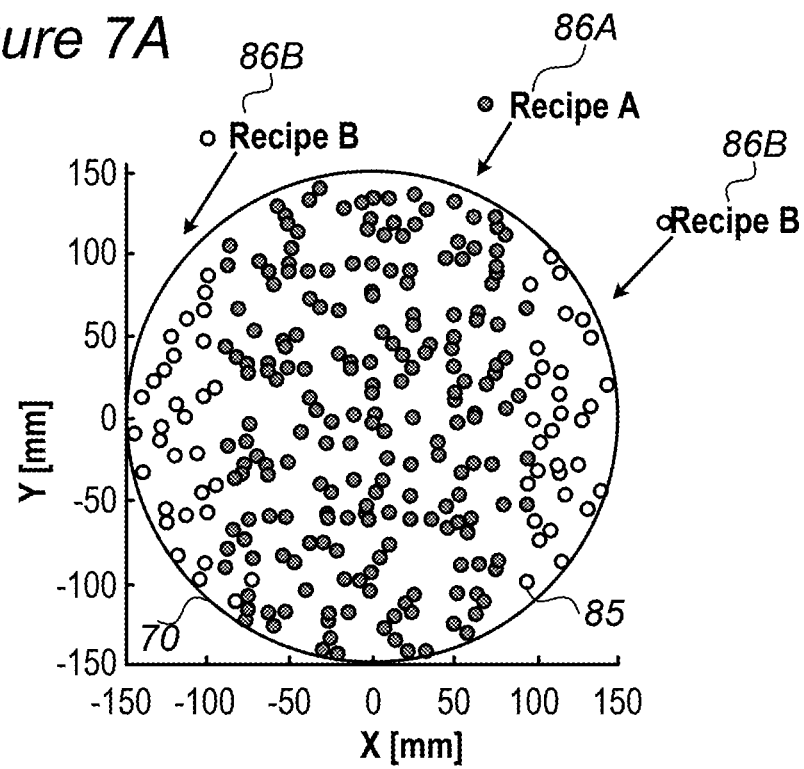

FIGS. 7A-7D are high-level schematic illustrations the improved accuracy achieved by combining recipes 86 over wafer 70, according to some embodiments of the invention. The illustrated example is based on ca. 300 site measurements on IBO targets. FIG. 7A illustrates measurements using one Recipe A 86A, which provides low inaccuracy at the central part of wafer 70 and high inaccuracy at two side regions of wafer 70. FIG. 7B illustrates allocation of alternative Recipe 86B to the side regions of wafer 70. Recipe B 86B having lower inaccuracy at these specific regions than Recipe A 86A. FIG. 7C illustrates a typical prior art solution of correction of the measurements at the level of the calculation model 88 and FIG. 7D compares the performance of disclosed combined recipes with the prior art correction and the combination of accuracy provided by the Recipes A and B, split according to model terms, to indicate the overmeasurement in prior art methods that results in overall higher inaccuracy compared to disclosed combined recipes.

Advantageously, combining a few recipes across wafers 70 provides selecting for each zone 90 and/or site 85 the best recipe that is suitable for it from physical considerations, and provides more accurate metrology values across wafer 70.

Disclosed embodiments provide a methodology for reducing residuals 99 as well as for performing a breakdown of residuals components 109 for evaluating the real contribution of inaccuracies to residuals 99. Advantageously, disclosed systems 100 and methods 200 considerably increase the overlay metrology ability to select accurate, robust and well modeled overlay recipes as well as performing root cause analysis 130 of the wafer behavior in term of accuracy, process variation, model relevancy etc.

In certain embodiments, systems 100 and methods 200 may be configured to select measurement parameters 88 as a measurement recipe for sites 85 which do not present a clear zone signature, and/or at boundaries between zones 90 and/or in areas that are not allocated to specific zones 90.

In certain embodiments, metrology module 101 may be further configured to analyze components 109 of residuals 99 with respect to associated process errors 75 and in relation to wafer site locations 85. Methods 200 may be configured to analyze the components of the residuals with respect to associated process errors and in relation to wafer site locations (stage 270).

Disclosed embodiments enable further analysis of residuals components 109. e.g., spatial analysis 120, to provide further correction and analysis 130 of process variation and errors 75, beyond zonal analysis 95 and systematic zonal signatures 115. The analysis of residuals components 109 may be carried out per site 85 and possibly used to allocated eights to measurements from different sites 85. Advantageously, residuals components 109, spatial analysis 120 and spatial model 122 provide information concerning non-systematic components of residuals 99, enhancing the accuracy of measurements 87. The identification of residuals components 109 may further be optimized per site 85, e.g., with respect to multiple recipes and metrics 89 and/or multiple landscapes 77 at each site 85.

It is noted that one of the most important indicators the fab is relying on for stability and accuracy evaluation of the selected recipe is residuals 99, which express the difference between the modeled overlay, calculated by extracting the correctable term for the overlay correction and the real per-site overlay received from overlay metrology. It is assumed that a good fit of the model is also a good indication of the overlay metrology performance and accuracy. However, as understood by the inventors, the quality of fit is not necessarily directly correlated to the real accuracy, and a well distributed process variation could be modelled with low residuals 99, which may potentially lead to errors in the recipe selection.

Aspects of the present invention are described above with reference to flowchart illustrations and or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, oilier programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/r portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is nor to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   identifying, per wafer site, components of residuals from measurement of at least one metrology metric, and
   optimizing measurement parameters of a measurement recipe of a metrology tool for each site, according to the components of the residuals,
   wherein at least one of the identifying and the optimizing is carried out by at least one computer processor.

2. The method of claim 1, further comprising identifying the components of the residuals by comparing at least one metrology landscape for the wafer sites, wherein the metrology landscape comprises an at least partially continuous dependency of the at least one metrology metric on at least one metrology measurement recipe parameter.

3. The method of claim 2, further comprising carrying out the identifying and the optimizing at wafer sites that exhibit high landscape sensitivity.

4. The method of claim 2, further comprising relating changes in the landscape spatially with respect to the wafer sites, and carrying out the optimization with respect to the spatial relation.

5. The method of claim 4, further comprising identifying root causes for the residuals based on the spatial relation.

6. The method of claim 2, wherein the identifying components of the residuals is carried out by principal component analysis (PCA).

7. The method of claim 1, further comprising removing systematic zonal signatures from the measurement to derive the residuals, prior to the identifying and the optimizing.

8. The method of claim 7, further comprising carrying out the identifying and the optimizing at wafer sites located at zonal boundaries.

9. The method of claim 1, further comprising relating changes in the components of the residuals spatially with respect to the wafer sites, and carrying out the optimization with respect to the spatial relation.

10. The method of claim 1, further comprising using zonal analysis that relates spatially variable values of at least one setup parameter to wafer location, with respect to at least one setup metrology metric that is different from the at least one metrology metric that is used to carry out the identifying and the optimizing.

11. The method of claim 1, further comprising analyzing the components of the residuals with respect to associated process errors and in relation to wafer site locations.

12. A computer program product comprising a non-transitory computer readable storage medium having computer readable program embodied therewith, the computer readable program configured to carry out the method of claim 1.

13. A metrology module configured to identify, per wafer site, components of residuals from measurement of at least one metrology metric, and to optimize measurement parameters of a measurement recipe of a metrology tool for each site, according to the identified components of the residuals.

14. The metrology module of claim 13, further configured to identify the components of the residuals by comparing at least one metrology landscape for the wafer sites, wherein the metrology landscape comprises an at least partially continuous dependency of the at least one metrology metric on at least one metrology measurement recipe parameter.

15. The metrology module of claim 14, further configured to carry out the identifying and the optimizing at wafer sites that exhibit high landscape sensitivity.

16. The metrology module of claim 13, wherein the identifying components of the residuals is carried out by principal component analysis (PCA).

17. The metrology module of claim 13, further configured to remove systematic zonal signatures from the measurement to derive the residuals, prior to the identifying and the optimizing.

18. The metrology module of claim 13, further configured to relate changes in the components of the residuals spatially with respect to the wafer sites, and carry out the optimization with respect to the spatial relation.

19. The metrology module of claim 13, further configured to use zonal analysis that relates spatially variable values of at least one setup parameter to wafer location, with respect to at least one setup metrology metric that is different from the at least one metrology metric that is used to carry out the identifying and the optimizing.

20. The metrology module of claim 13, further configured to analyze the components of the residuals with respect to associated process errors and in relation to wafer site locations.

* * * * *